US008633781B2

(12) United States Patent
Bradley et al.

(10) Patent No.: US 8,633,781 B2
(45) Date of Patent: Jan. 21, 2014

(54) COMBINED BALUN AND IMPEDANCE MATCHING CIRCUIT

(75) Inventors: Paul Bradley, Los Altos, CA (US); Michael Frank, Menlo Park, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 419 days.

(21) Appl. No.: 12/973,986

(22) Filed: Dec. 21, 2010

(65) Prior Publication Data

US 2012/0154071 A1 Jun. 21, 2012

(51) Int. Cl.
*H01P 5/10* (2006.01)
*H03H 7/42* (2006.01)
*H03H 9/00* (2006.01)

(52) U.S. Cl.
USPC .................................. 333/4; 333/26; 333/187

(58) Field of Classification Search
USPC .......................................... 333/25, 26, 4, 187
See application file for complete search history.

(56) References Cited

U.S. PATENT DOCUMENTS

| | | | |
|---|---|---|---|
| 5,304,961 A * | 4/1994 | Dydyk | 333/112 |
| 5,587,620 A | 12/1996 | Ruby et al. | |
| 5,873,153 A | 2/1999 | Ruby et al. | |
| 5,949,299 A * | 9/1999 | Harada | 333/25 |
| 6,107,721 A | 8/2000 | Lakin | |
| 6,507,983 B1 | 1/2003 | Ruby et al. | |
| 6,803,835 B2 | 10/2004 | Frank | |
| 6,952,142 B2 * | 10/2005 | Guitton et al. | 333/25 |
| 7,196,596 B2 * | 3/2007 | Sul | 333/187 |
| 2005/0093652 A1 | 5/2005 | Ma et al. | |
| 2006/0071736 A1 | 4/2006 | Ruby et al. | |
| 2006/0103484 A1 | 5/2006 | Ezzeddine | |
| 2006/0103492 A1 | 5/2006 | Feng et al. | |
| 2007/0085108 A1 | 4/2007 | White et al. | |
| 2007/0205850 A1 | 9/2007 | Jamneala et al. | |
| 2007/0279153 A1 | 12/2007 | Ruby | |
| 2009/0079514 A1 | 3/2009 | Jamneala et al. | |
| 2010/0026414 A1 | 2/2010 | Iwaki et al. | |

FOREIGN PATENT DOCUMENTS

| | | |
|---|---|---|
| GB | 2456522 | 7/2009 |
| JP | 2002043882 | 2/2002 |
| TW | I264176 | 10/2006 |
| WO | WO-2011/008866 | 1/2011 |

* cited by examiner

*Primary Examiner* — Dean O Takaoka

(57) ABSTRACT

An apparatus for providing impedance matching between a single-ended circuit and a differential circuit includes first and second capacitors and first and second inductors. The first capacitor is connected between an input/output of the single-ended circuit and a first differential input/output of the differential circuit. The first inductor is connected between the input/output of the single-ended circuit and a second differential input/output of the differential circuit. The second capacitor is connected between the second differential input/output of the differential circuit and ground. The second inductor is connected between the first differential input/output of the differential circuit and the second differential input/output of the differential circuit.

20 Claims, 5 Drawing Sheets

COMBINED BALUN AND IMPEDANCE MATCHING CIRCUIT

BACKGROUND

Portable communication devices, such as cellular telephones, personal digital assistants (PDAs), electronic gaming devices, laptop computers, and the like, are configured to communicate over wireless networks. Accordingly, each such portable communication device relies on a receiver and a transmitter, typically connected to a single or common antenna, for sending and receiving data and control signals over the wireless network. Of course, the receiver and transmitter may be incorporated into a transceiver, having a receiver portion and a transmitter portion. In order to use the common antenna, a duplexer is included to interface between the antenna and each of the receiver portion and the transmitter portion, so that the receiver portion is able to receive signals on a receive (downlink) frequency, and the transmitter portion is able to send signals on a different transmit (uplink) frequency. Generally, the duplexer includes two band-pass filters having different passbands for filtering the receive and transmit signals, respectively, thus preventing or reducing interference between the receive and transmit signals.

Various types of wireless network are implemented according to different communication standards, such as universal mobile telecommunications system (UMTS), global system for mobile communication (GSM), personal communications services (PCS), digital cellular system (DCS), international mobile telecommunication (IMT), and enhanced data rates for GSM evolution (EDGE). The communication standards identify separate bands for transmitting and receiving signals. For example, UMTS band 2 (PCS) provides an uplink frequency band of 1850 MHz-1910 MHz and a downlink frequency band of 1930 MHz-1990 MHz; UMTS band 3 (DCS) provides an uplink frequency band of 1710 MHz-1785 MHz and a downlink frequency band of 1805 MHz-1880 MHz; UMTS band 7 (IMT-E) provides an uplink frequency band of 2500 MHz-2570 MHz and a downlink frequency band of 2620 MHz-2690 MHz; and UMTS band 8 (GMS-900) provides an uplink frequency band of 880 MHz-915 MHz and a downlink frequency band of 925 MHz-960 MHz. Accordingly, a duplexer operating in compliance with a UMTS standard would include a transmit filter having a passband within the corresponding uplink frequency band, and a receive filter having a passband within the corresponding downlink frequency band.

As mentioned above, a duplexer includes two band-pass filters having different passbands for filtering the receive and transmit signals, respectively. The band-pass filters may include acoustic resonators, such as surface acoustic wave (SAW) resonators or thin film bulk acoustic resonators (FBARs), for example, for filtering the receive and transmit signals. Impedance matching circuits are needed to enable the duplexer to interface with the receive and transmit portions of a transceiver, respectively.

One difference between a band-pass filter having SAW resonators (SAW filter) and a band-pass filter having FBARs (FBAR filter) is that the SAW filter has a differential input/output for differential (balanced) signals, while the FBAR filter has a single-ended input/output for single-ended (unbalanced) signals. Therefore, a SAW filter is able to interface directly with the receive or transmit portion of the transceiver, which likewise have a differential input/output, while the FBAR filter relies on balun circuits (in addition to the impedance matching circuits), for example, to convert between single-ended and differential signals in order to interface with the transmit and receive portions of the transceiver. Therefore, the circuitry and layout architecture for interfacing the different types of duplexers with transceivers are not interchangeable. For example, a portable communication device printed circuit board (PCB), designed to include a transceiver and a duplexer having SAW filters, does not include circuitry or space for balun circuits. Thus, a different PCB design would be required to accommodate a duplexer having FBAR filters.

SUMMARY

In a representative embodiment, an apparatus for providing impedance matching between a single-ended circuit and a differential circuit includes first and second capacitors and first and second inductors. The first capacitor is connected between an input/output of the single-ended circuit and a first differential input/output of the differential circuit. The first inductor is connected between the input/output of the single-ended circuit and a second differential input/output of the differential circuit. The second capacitor is connected between the second differential input/output of the differential circuit and ground. The second inductor is connected between the first differential input/output of the differential circuit and the second differential input/output of the differential circuit.

In another representative embodiment, an apparatus for providing impedance matching between a duplexer circuit and a transceiver circuit mounted on a printed circuit board (PCB) includes an impedance matching circuit and a balun circuit. The impedance matching circuit includes a first capacitor connected between a single-ended input/output of the duplexer circuit and a first differential input/output of the transceiver, a first inductor connected between the single-ended input/output of the duplexer filter and a first node, an LC component connected between the first node a second differential input/output of the transceiver, and a second inductor connected between the first differential input/output and the second differential input/output of the transceiver. The balun circuit includes the first capacitor, the first inductor, and a second capacitor connected between the first node and ground, the balun circuit being configured to convert between unbalanced signals at the single-ended input/output of the duplexer circuit and balanced signals at the first and second differential inputs/outputs of the differential transceiver circuit.

In another representative embodiment, an apparatus is configured to convert between an unbalanced signal of a receive portion of a duplexer on a first chip mounted on a PCB and a balanced signal of a receiver portion of a transceiver on a second chip mounted to the PCB, the receive portion of the duplexer including a film bulk acoustic resonator (FBAR) filter and the receiver portion of the transceiver including first and second low noise amplifiers (LNAs). The apparatus comprises a balun circuit including a first capacitor connected between a single-ended output of the FBAR filter and a first differential input of the first LNA, a first inductor connected between the single-ended output of the FBAR filter and a first node, and a second capacitor connected between the first node and ground. The apparatus further comprises an impedance matching circuit including the first capacitor, the first inductor, an LC component connected between the first node and a second differential input of the second LNA, and a second inductor connected between the first differential input of the first LNA and the second differential input of the second LNA. The second capacitor is located on the first chip, and the first capacitor, the first inductor, the second inductor and the LC component are mounted on the PCB to connect the first chip and the second chip.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
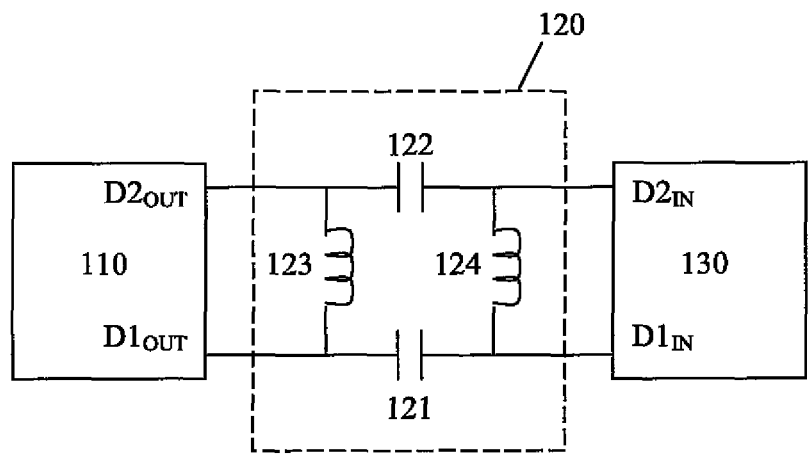
FIG. 1 is a block diagram illustrating an impedance matching circuit connecting differential circuit connections, respectively.

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

Generally, it is understood that the drawings and the various elements depicted therein are not drawn to scale. Further, relative terms, such as "above," "below," "top," "bottom," "upper" and "lower" are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be below that element.

FIG. 1 is a block diagram illustrating an impedance matching circuit connecting two circuits having differential connections. In particular, FIG. 1 shows first differential circuit 110 connected to second differential circuit 130 through impedance matching circuit 120. The first differential circuit 110 may be a receive portion of a duplexer having a SAW filter, and the second differential circuit 130 may be a receiver portion of a transceiver, for example. The impedance matching circuit 120 includes a first capacitor 121 connected between first differential output $D1_{OUT}$ of the first differential circuit 110 and first differential input $D1_{IN}$ of the second differential circuit 130, and a second capacitor 122 connected between second differential output $D2_{OUT}$ of the first differential circuit 110 and second differential input $D2_{IN}$ of the second differential circuit 130. A first inductor 123 is connected between the first and second differential outputs $D1_{OUT}$ and $D2_{OUT}$ of the first differential circuit 110, and a second inductor 124 is connected between the first and second differential inputs $D1_{IN}$ and $D2_{IN}$ of the second differential circuit 130.

Figure 2:
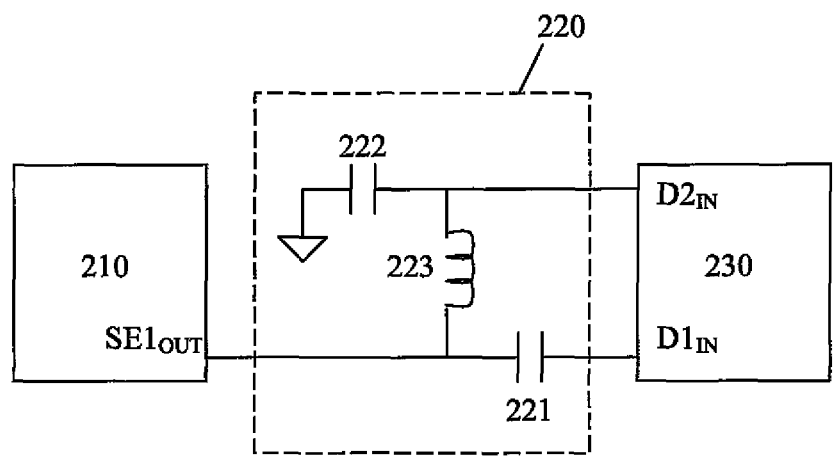
FIG. 2 is a block diagram illustrating a balun circuit connecting single-ended and differential circuit connections, respectively.

FIG. 2 is a block diagram illustrating a balun circuit connecting circuits having single-ended and differential connections, respectively. In particular, FIG. 2 shows single-ended circuit 210 connected to differential circuit 230 through balun circuit 220. The single-ended circuit 210 may be a receive portion of a duplexer having an FBAR filter, and the differential circuit 230 may be a receiver portion of a transceiver, for example. The balun circuit 220 includes a first capacitor 221 connected between single-ended output $SE1_{OUT}$ of the single-ended circuit 210 and first differential input $D1_{IN}$ of the differential circuit 230, a second capacitor 222 connected between ground and second differential input $D2_{IN}$ of the differential circuit 230, and an inductor 223 connected between the single-ended output $SE1_{OUT}$ of the single-ended circuit 210 and the second differential input $D2_{IN}$ of the differential circuit 230. The balun circuit 220, as shown, is configured to convert between single-ended (unbalanced) signals of the single-ended circuit 210 and differential (balanced) signals of the differential circuit 230.

Figure 3:
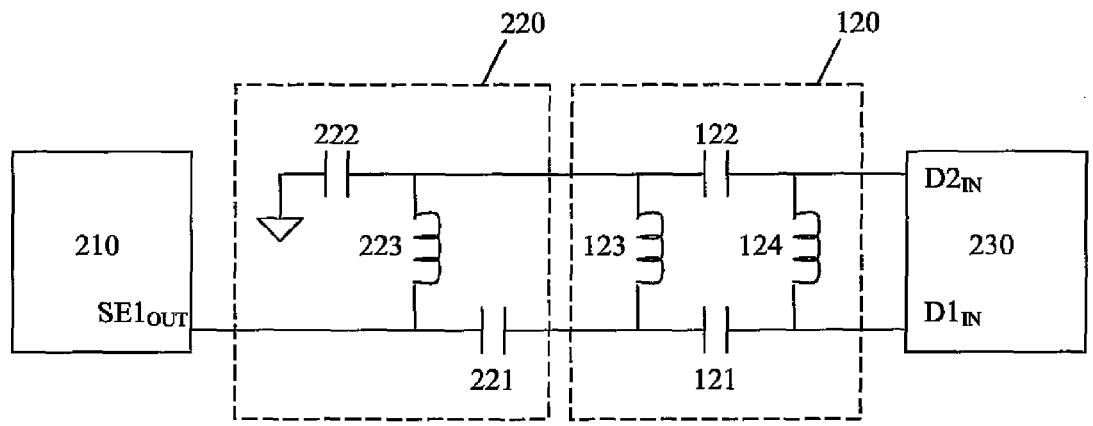
FIG. 3 is a block diagram illustrating a combined balun and impedance matching circuit connecting single-ended and differential circuit connections, respectively.

FIG. 3 is a block diagram illustrating a combined balun and impedance matching circuit connecting circuits having single-ended and differential connections, respectively. In particular, FIG. 3 shows the single-ended circuit 210 connected to the differential circuit 230 through both the balun circuit 220 and the impedance matching circuit 120, discussed above with reference to FIGS. 1 and 2, respectively. The differential signals of the balun circuit 220 are provided to first and second differential inputs $D1_{IN}$ and $D2_{IN}$ of the differential circuit 230 via the impedance matching circuit 120. As a result, the differential circuit 230 receives balanced and impedance matched signals corresponding to the unbalanced signals output by the single-ended circuit 210.

Figure 4:
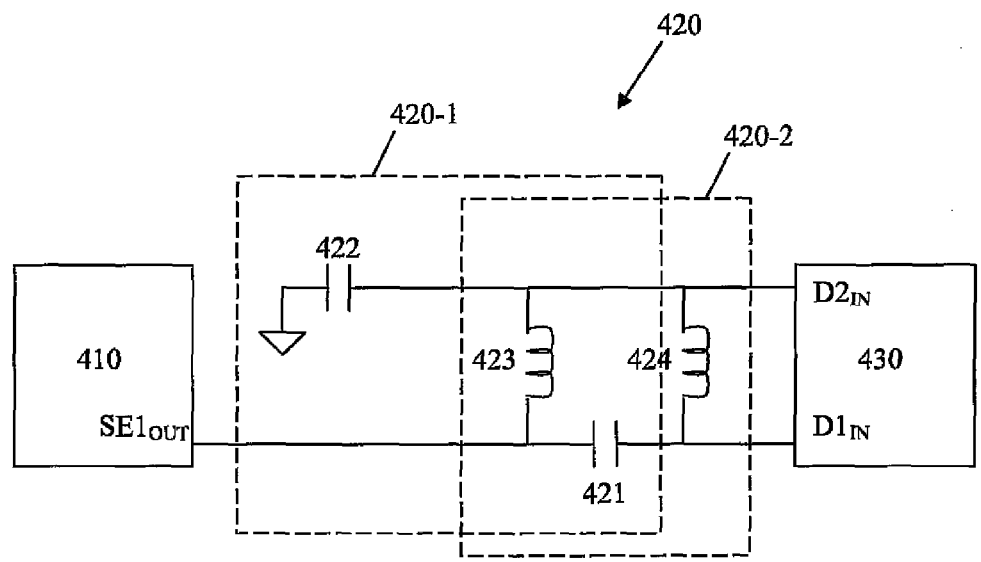
FIG. 4 is a block diagram illustrating a combined balun and impedance matching circuit connecting single-ended and differential circuits, according to a representative embodiment.

FIG. 4 is a block diagram illustrating a combined balun and impedance matching circuit connecting circuits having single-ended and differential connections, according to a representative embodiment. In particular, FIG. 4 shows single-ended circuit 410 connected to differential circuit 430 through balun/impedance matching circuit 420, which includes balun circuit 420-1 and impedance matching circuit 420-2. As discussed above, the single-ended circuit 410 may be a receive portion of a duplexer having an FBAR filter, and the differential circuit 430 may be a receiver portion of a transceiver, for example.

In the depicted embodiment, the balun circuit 420-1 and the impedance matching circuit 420-2 share one or more LC components to perform their respective functionalities. In particular, the balun circuit 420-1 includes a first capacitor 421 connected between single-ended output $SE1_{OUT}$ of the single-ended circuit 410 and first differential input $D1_{IN}$ of the differential circuit 430, a second capacitor 422 connected between ground and second differential input $D2_{IN}$ of the differential circuit 430, and a first inductor 423 connected between the single-ended output $SE1_{OUT}$ of the single-ended circuit 410 and the second differential input $D2_{IN}$ of the differential circuit 430. The impedance matching circuit 420-2 includes the first capacitor 421, the first inductor 423, and a second inductor 424 connected between the first differential input $D1_{IN}$ and the second differential input $D2_{IN}$ of the differential circuit 430. Accordingly, the balun circuit 420-1 and the impedance matching circuit 420-2 share the first capacitor 421 and the first inductor 423. Of course, in addition to converting single-ended signals output by the single-ended circuit 410 to differential signals received by the differential circuit 430, the balun/impedance matching circuit 420 is likewise able to convert differential signals output by the differential circuit 430 to single-ended signals received by the single-ended circuit 410.

Referring to FIGS. 3 and 4, it has been determined that the first inductor 123 of the impedance matching circuit 120 is unnecessary, particularly when the length of the line or trace connecting the single-ended output $SE1_{OUT}$ of the single-ended circuit 410 and the first differential input $D1_{IN}$ of the differential circuit 430 is relatively short (e.g., less than about 1 cm). Without the first inductor 123, the first capacitor 121 of the impedance matching circuit 120 and the first capacitor 221 of the balun circuit 220 can be combined, e.g., indicated by first capacitor 421 in FIG. 4. Also, it has been determined that the second capacitor 122 of the impedance matching circuit 120 is likewise unnecessary in order to perform impedance matching. Thus, the balun/impedance matching circuit 420 of FIG. 4 is able to perform the combined functionality of the balun circuit 220 and the impedance matching circuit 120 of FIG. 3 using only four LC components (first capacitor 421, second capacitor 422, first inductor 423, and second inductor 424) as compared to seven LC components.

Figure 5:
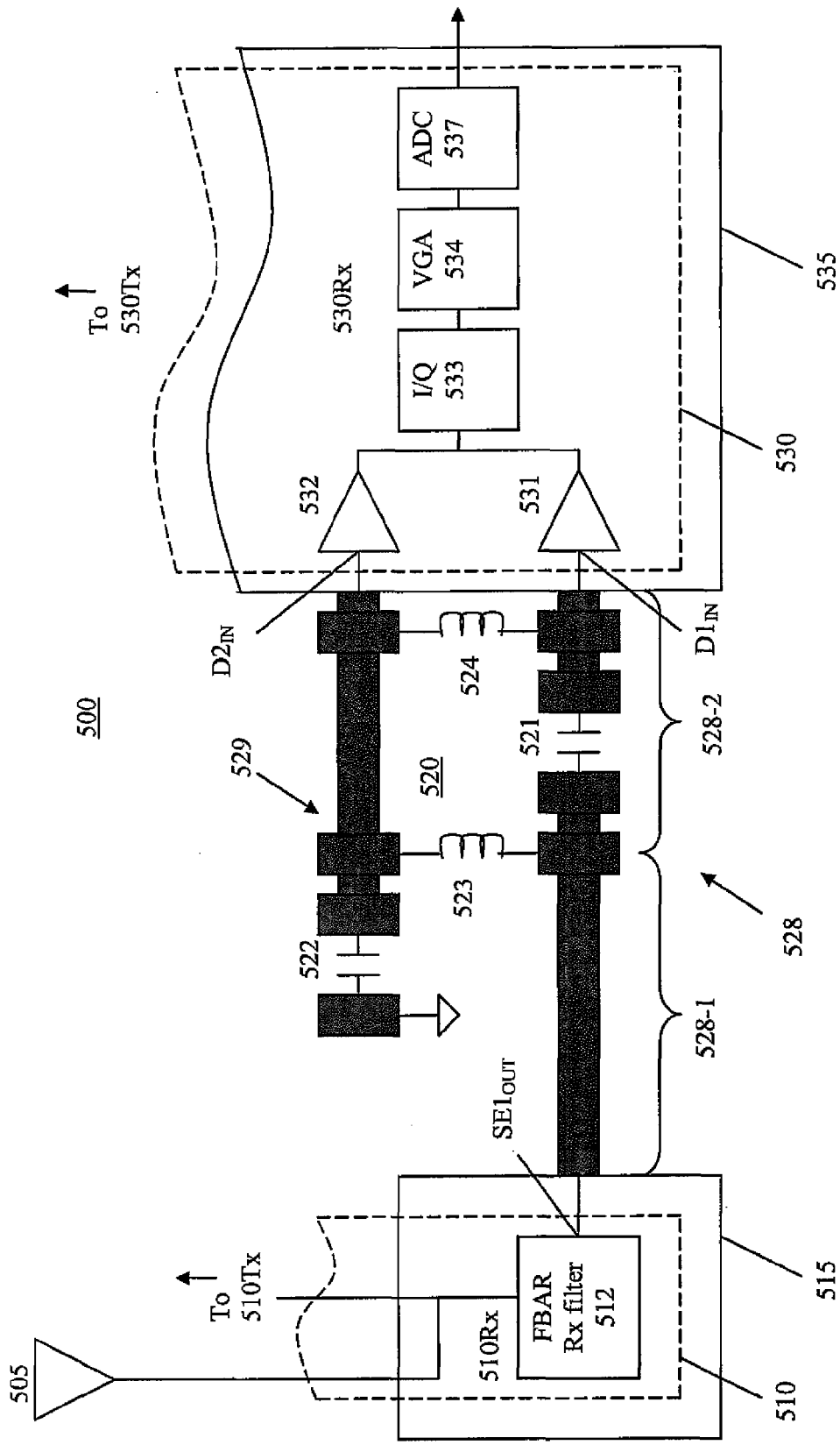
FIG. 5 is a block diagram illustrating a combined balun and impedance matching circuit connecting single-ended and differential circuits on a printed circuit board, according to a representative embodiment.

FIG. 5 is a block diagram illustrating an implementation of a combined balun and impedance matching circuit connecting circuits having single-ended and differential connections on a printed circuit board, according to a representative embodiment. The depicted implementation includes a combined balun and impedance matching circuit configuration as shown in FIG. 4, for example.

Referring to FIG. 5, Rx duplexer chip 515, transceiver chip 535 and components of balun/impedance matching circuit 520 are mounted on a printed circuit board (PCB) 500. The RX duplexer chip 515 includes duplexer receive portion 510Rx of duplexer 510, which is connected to antenna 505. In the depicted embodiment, duplexer transmit portion 510Tx of the duplexer 510 is included on a separate TX duplexer chip (not shown), although in alternative configurations, the duplexer transmit portion 510Tx and the duplexer receive portion 510Rx may be included on the same chip, without departing from the scope of the present teachings. The transceiver chip 535 contains transceiver 530, which includes receiver portion 530Rx and transmitter portion 530Tx. In the depicted embodiment, the receiver portion 530Rx and the transmitter portion 530Tx of the transceiver 530 are included on the same transceiver chip 535, although in alternative configurations, the transmitter portion 530Tx may be included on a separate chip from the receiver portion 530Rx, without departing from the scope of the present teachings. In various configurations, the duplexer 510, the balun/impedance matching circuit 520 and the transceiver 530 may be incorporated into various types of portable communication devices, such as cellular telephones, PDAs, electronic gaming devices, laptop computers and the like.

The duplexer 510 interfaces the transceiver 530 with the antenna 505 for downlink and uplink frequency bands, corresponding to a particular communication standard, such as UMTS band 2 (PCS), UMTS band 3 (DCS), UMTS band 7 (IMT-E) or UMTS band 8 (GMS-900), as discussed above. FIG. 5 shows only the receive portion 510Rx of the duplexer 510 for convenience of explanation. The duplexer receive portion 510Rx includes FBAR Rx filter 512, which has an input connected to the antenna 505 and a single-ended output corresponding to the single-ended output $SE1_{OUT}$ of the duplexer receive portion 510Rx. The FBAR Rx filter 512 may be a ladder type filter having series and shunt connected acoustic resonators, a phase shifter or other matching circuit, and associated LC components, although the FBAR Rx filter 512 may include other configurations without departing from the scope of the present teachings. Each of the acoustic resonators may include a thin film piezoelectric layer, such as aluminum nitride (AlN), zinc oxide (ZnO) or lead zirconate titanate (PZT), formed in a stacked structure between top and bottom electrodes. The transmit portion 510Tx (not shown) of the duplexer 510 may include an FBAR Tx filter, an output of which is also connected to the antenna 505.

Certain aspects of the present teachings relate to and build upon FBAR devices and FBAR-based filters. Many details of FBARs, materials thereof and their methods of fabrication may be found in one or more of the following illustrative U.S. patents and patent applications: U.S. Pat. No. 6,107,721 to Lakin; U.S. Pat. Nos. 5,587,620, 5,873,153 and 6,507,983 to Ruby, et al.; U.S. Patent Application Pub. Nos. 2007/0279153 and 2006/0071736 to Ruby, et al.; U.S. Patent Application Pub. No. 20060103492 to Hongjun Feng, et al.; and U.S. Patent Application Pub. No. 20070205850, to Jamneala, et al. The disclosures of these patents and patent applications are specifically incorporated herein by reference. It is emphasized that the components, materials and method of fabrication described in these patents and patent applications are representative and other methods of fabrication and materials within the purview of one of ordinary skill in the art are contemplated.

In various embodiments, the Rx duplexer chip 515 containing the duplexer receive portion 510Rx is physically dimensioned to fit in an area of the PCB 500 not necessarily designed for accommodating a duplexer chip with an FBAR Rx filter and a single-ended output. For example, the PCB 500 may be designed for a mobile phone implementation, in which the duplexer includes a SAW Rx filter, and thus has a differential output (such as first and second differential outputs $D1_{OUT}$ and $D2_{OUT}$ shown in FIG. 1, for example), rather than a single-ended output.

As stated above, the transceiver 530 includes a receiver portion 530Rx and a transmitter portion 530Tx (not shown), which may be on the same transceiver chip 535 or on separate chips. FIG. 5 shows only the receiver portion 530Rx of the transceiver 530 for convenience of explanation. The receiver portion 530Rx includes first and second low noise amplifiers (LNAs) 531 and 532, which have inputs corresponding to the first and second differential inputs $D1_{IN}$ and $D2_{IN}$ of the receiver portion 530Rx, respectively. The first and second LNAs 531 and 532 receive and amplify the differential signals from the balun/impedance matching circuit 520. The first and second LNAs 531 and 532 are typically presented with complex impedances, which depends, in part, on layout and parasitics of the PCB 500.

The receiver portion 530Rx further includes in-phase/quadrature (I/Q) demodulator 533, variable-gain amplifier (VGA) 534 and analog-to-digital converter (ADC) 537. Generally, the quadrature demodulator 533 down-converts the received high frequency (e.g., RF) differential signal to a baseband frequency. The down-converted signal is amplified by the VGA 534 and converted to a digital baseband signal by the ADC 537. The digital baseband signal may be output to a processor, for example, to process data included in the digital baseband signal. Of course, various alternative configurations of the receiver portion 530Rx may be included without departing from the scope of the present teachings, as would be apparent to one of ordinary skill in the art.

The first differential input $D1_{IN}$ of the first LNA 531 is connected to the single-ended output $SE1_{OUT}$ of the FBAR Rx filter 512 via receive path 528, which includes first trace 528-1, first capacitor 521, and second trace 528-2. The second differential input $D2_{IN}$ of the second LNA 532 is connected to ground via ground path 529, which includes second capacitor 522. Each of the first and second inductors 523 and 524 are connected between the receive path 528 and the ground path 529, thus forming the balun/impedance matching circuit 520. That is, the first capacitor 521 is connected between the single-ended output $SE1_{OUT}$ of the FBAR Rx filter 512 and the first differential input $D1_{IN}$ of the first LNA 531; the second capacitor 522 is connected between the second differential input $D2_{IN}$ of the second LNA 532 and ground; the first inductor 523 is connected between the single-ended output $SE1_{Out}$ and the second differential input $D2_{IN}$; and the second inductor 524 is connected between the first differential input $D1_{IN}$ and the second differential input $D2_{IN}$. Accordingly, the first capacitor 521, the second capacitor 522, and the first inductor 523 provide balun functionality, and the first capacitor 521, the first inductor 523, and the second inductor 524 provide impedance matching functionality.

The first trace 528-1 of the receive path 528 may be significantly longer than the second trace 528-2. For example, the first trace 528-1 may as much as about 2.54 cm long in a typical handset design, although lengths may vary to provide unique benefits for particular situations or to meet application specific design requirements of various implementations. Further, if the characteristic impedance is matched to impedance of the single-ended output $SE1_{OUT}$ of the FBAR Rx filter 512, the same component values may be used in the balun/impedance matching circuit 520 to connect to the transceiver 530 on different handsets simplifying fine-tuning of the balun/impedance matching circuit 520 in a given handset. For example, assuming the receive path 528 has a length of about 15 mm from the single-ended output $SE1_{OUT}$ of the FBAR Rx filter 512 to the first differential input $D1_{IN}$ of the first LNA 531, the first trace 528-1 may be about 14 mm in length. Therefore, the signal output from the single-ended output $SE1_{OUT}$ traverses a single trace (first trace 538-1) over the majority of the receive path 528. Using a single trace is advantageous because it eliminates a large number of traces and wasted space in a handset with multiple different frequency receivers. Using a single trace also removes the requirement for perfect length and impedance matching between the two differential lines needed to maintain good phase and amplitude balance for proper operation. In addition, such an arrangement results in short differential lines from the output of the balun portion of the balun/impedance matching circuit 520 (first capacitor 521, second capacitor 522, first inductor 523) to the receiver portion 530Rx, which is advantageous because the short differential lines are the only place between the duplexer 510 and the transceiver 530 where good balance must be maintained for proper operation.

In an embodiment, the first capacitor 521, the second capacitor 522, the first inductor 523, and the second inductor 524 are surface mounted technology (SMT) components mounted to the PCB 500. Alternatively, the second capacitor 522 may be formed between multiple conductive layers of the PCB 500, or formed on a portion of the Rx duplexer chip 515. Of course, various other configurations of one or more of the LC components may be included, without departing from the scope of the present teachings, to provide unique benefits for any particular situation or to meet application specific design requirements of various implementations.

Of course, the respective values of the LC components shown in FIG. 5 may vary to provide unique benefits for any particular situation or to meet application specific design requirements of various implementations. For example, assuming that the first trace 528-1 has any appropriate length and the second trace 528-2 has a length of about 1.0 mm, in order to implement the PCS communication standard, the first capacitor 521 may have a value of about 1.0 pF, the second capacitor 522 may have a value of about 1.8 pF, the first inductor 523 may have a value of about 6.7 nH, and the second inductor 524 may have a value of about 4.9 nH.

Figure 6A:
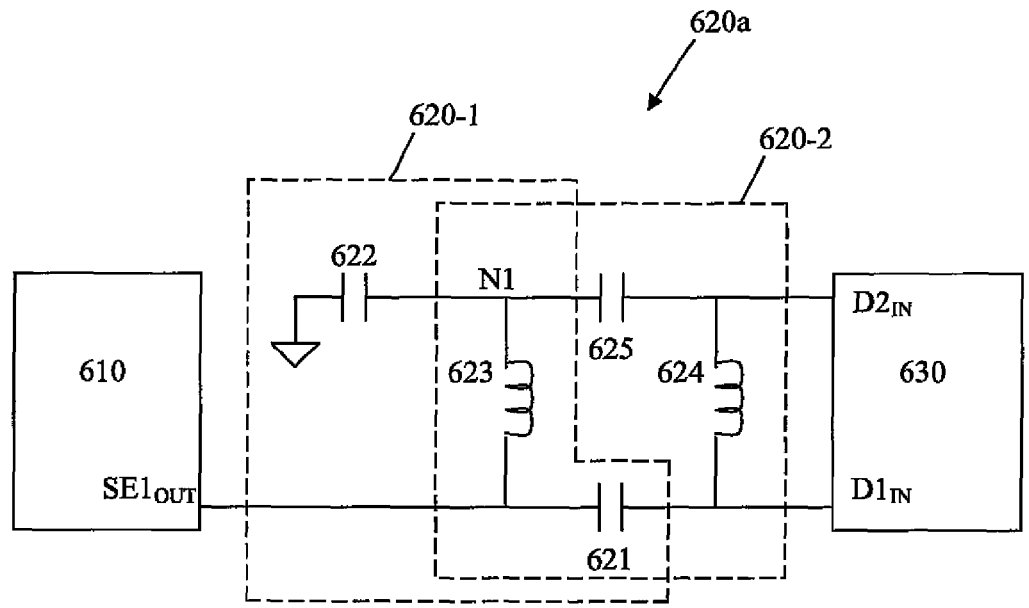
FIG. 6A is a block diagram illustrating a combined balun and impedance matching circuit connecting single-ended and differential circuits, according to another representative embodiment.
Figure 6B:
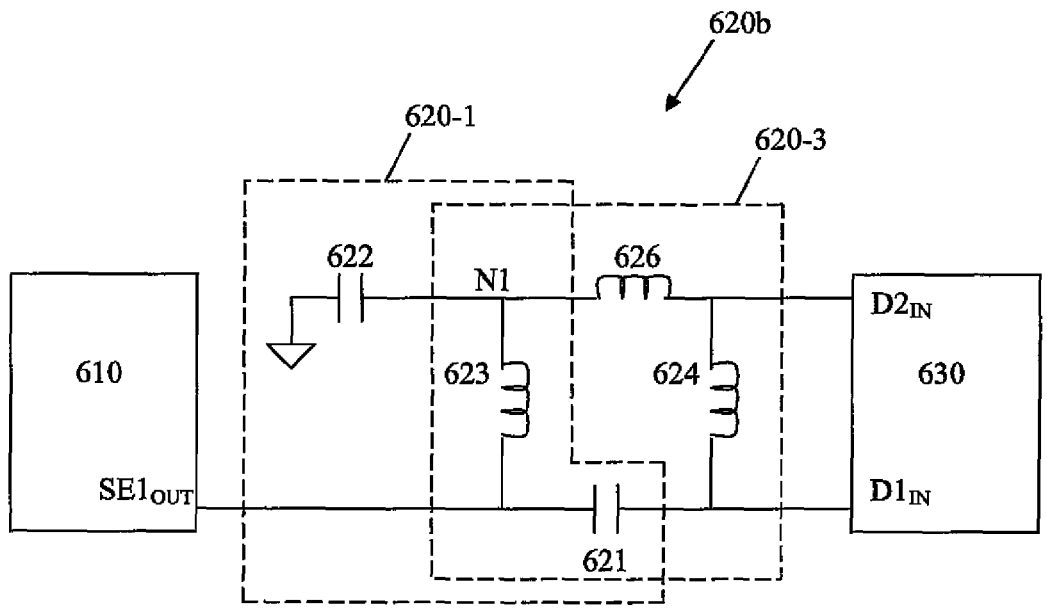
FIG. 6B is a block diagram illustrating a combined balun and impedance matching circuit connecting single-ended and differential circuits, according to another representative embodiment.

FIGS. 6A and 6B are block diagram illustrating combined balun and impedance matching circuits connecting circuits having single-ended and differential connections, according to representative embodiments. In particular, FIG. 6A shows single-ended circuit 610 connected to differential circuit 630 through balun/impedance matching circuit 620a, which includes balun circuit 620-1 and impedance matching circuit 620-2, and FIG. 6B shows single-ended circuit 610 connected to differential circuit 630 through balun/impedance matching circuit 620b, which includes balun circuit 620-1 and impedance matching circuit 620-3. The difference between FIGS. 6A and 6B is the type of one LC component in the impedance matching circuits 620-2 and 620-3. In particular, the impedance matching circuit 620-2 in the balun/impedance matching circuit 620a includes third capacitor 625, while the impedance matching circuit 620-3 in the balun/impedance matching circuit 620b includes third inductor 626 (instead of the third capacitor 625).

Notably, both balun/impedance matching circuits 620a and 620b include five LC components, as compared to the four LC components in the balun/impedance matching circuit 420 of FIG. 4 (although the balun/impedance matching circuits 620a and 620b still include fewer LC components than the seven LC components depicted in the combined balun circuit 220 and impedance matching circuit 120 of FIG. 3). By incorporating the additional LC component, the balun/impedance matching circuits 620a and 620b may conveniently replace a conventional impedance matching circuit used to connect two differential circuits, such as first and second differential circuits 110 and 130 shown in FIG. 1. For example, the balun/impedance matching circuit 620a or 620b may be included in an area of a printed circuit board designed for an impedance matching circuit that connects a duplexer having a differential output (e.g., including a SAW filter) and a receiver having a differential input. Accordingly, the same printed circuit board design may be used for a duplexer having a single-ended output (e.g., including an FBAR filter) connected to the differential input receiver via the balun/impedance matching circuit 620a or 620b, by adding a capacitor (e.g., second capacitor 622), as discussed below.

Referring to FIG. 6A, single-ended circuit 610 is connected to differential circuit 630 through balun/impedance matching circuit 620a, which includes balun circuit 620-1 and impedance matching circuit 620-2. As discussed above, the single-ended circuit 610 may be a receive portion of a duplexer having an FBAR filter, and the differential circuit 630 may be a receiver portion of a transceiver, for example. In the depicted embodiment, the balun circuit 620-1 and the impedance matching circuit 620-2 share one or more LC components to perform respective functionalities. In particular, the balun circuit 620-1 includes a first capacitor 621 connected between single-ended output $SE1_{OUT}$ of the single-ended circuit 610 and first differential input $D1_{IN}$ of the differential circuit 630, a second capacitor 622 connected between node N1 and ground, and a first inductor 623 connected between the single-ended output $SE1_{OUT}$ of the single-ended circuit 610 and node N1. The impedance matching circuit 620-2 includes the first capacitor 621, the first inductor 623, a second inductor 624 connected between the first differential input $D1_{IN}$ and the second differential input $D2_{IN}$ of the differential circuit 630, and a third capacitor 625 connected between node N1 and the second differential input $D2_{IN}$ of the differential circuit 630. Accordingly, the balun circuit 620-1 and the impedance matching circuit 620-2 share the first capacitor 621 and the first inductor 623. Assuming the differential circuit 630 is a receiver and the single-ended circuit 610 is a duplexer having an FBAR filter, as discussed below with reference to FIG. 7, the inclusion of the third capacitor 625 improves DC blocking with respect to the differential signal received by the receiver.

Similarly, referring to FIG. 6B, single-ended circuit 610 is connected to differential circuit 630 through balun/impedance matching circuit 620b, which includes balun circuit 620-1 and impedance matching circuit 620-3. In the depicted embodiment, the balun circuit 620-1 includes a first capacitor 621 connected between single-ended output $SE1_{OUT}$ of the single-ended circuit 610 and first differential input $D1_{IN}$ of the differential circuit 630, a second capacitor 622 connected between node N1 and ground, and a first inductor 623 connected between the single-ended output $SE1_{OUT}$ of the single-ended circuit 610 and node N1. The impedance matching circuit 620-3 includes the first capacitor 421, the first inductor 423, a second inductor 624 connected between the first differential input $D1_{IN}$ and the second differential input $D2_{IN}$ of the differential circuit 630, and a third inductor 626 connected between node N1 and the second differential input $D2_{IN}$ of the differential circuit 630. Accordingly, the balun circuit 620-1 and the impedance matching circuit 620-3 share the first capacitor 621 and the first inductor 623. Assuming the differential circuit 630 is a receiver and the single-ended circuit 610 is a duplexer having an FBAR filter, the inclusion of the third inductor 626 enhances performance characteristics of the receiver, such as insertion loss characteristics.

Of course, in addition to converting single-ended signals output by the single-ended circuit 610 to differential signals received by the differential circuit 630, the balun/impedance matching circuits 620a, 620b are likewise able to convert differential signals output by the differential circuit 630 to single-ended signals received by the single-ended circuit 610.

Notably, conventional impedance matching circuits used to connect two differential circuits include only four LC components (e.g., first and second capacitors 121, 122 and first and second inductors 123, 124 as shown in FIG. 1). Accordingly, in FIGS. 6A and 6B, the second capacitor 622 is an additional LC component with respect the conventional impedance matching circuits. As such, the second capacitor 622 may be accommodated outside the area of the printed circuit board designed for a conventional impedance matching circuit. For example, the second capacitor 622 may be formed between multiple conductive layers of the printed circuit board, formed on a portion of a chip containing the single-ended circuit 610, or formed as an SMT component at a location on the printed circuit board outside the area designed for the conventional impedance matching circuit.

Figure 7:
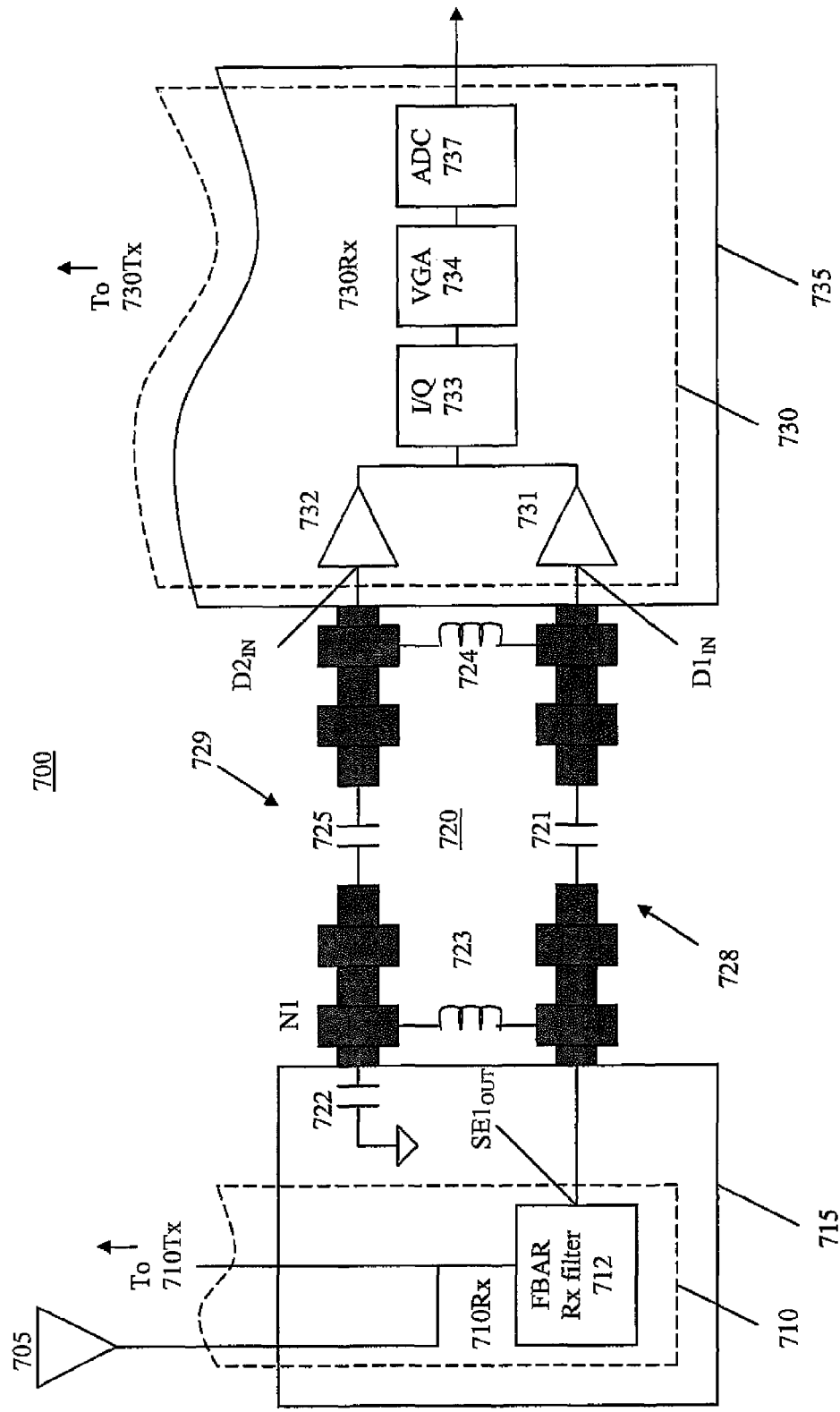
FIG. 7 is a block diagram illustrating a combined balun and impedance matching circuit connecting single-ended and differential circuits on a printed circuit board, according to another representative embodiment.

FIG. 7 is a block diagram illustrating an implementation of a combined balun and impedance matching circuit connecting circuits having single-ended and differential connections on a printed circuit board, according to a representative embodiment. The depicted implementation includes a combined balun and impedance matching circuit configuration as shown in FIG. 6A, for example.

Referring to FIG. 7, Rx duplexer chip 715, transceiver chip 735 and components of balun/impedance matching circuit 720 are mounted on PCB 700. The RX duplexer chip 715 includes duplexer receive portion 710Rx of duplexer 710, which is connected to antenna 705. In the depicted embodiment, duplexer transmit portion 710Tx of the duplexer 710 is included on a separate TX duplexer chip (not shown), although in alternative configurations, the duplexer transmit portion 710Tx and the duplexer receive portion 710Rx may be included on the same chip, without departing from the scope of the present teachings. The transceiver chip 735 contains transceiver 730, which includes receiver portion 730Rx and transmitter portion 730Tx. In the depicted embodiment, the receiver portion 730Rx and the transmitter portion 730Tx of the transceiver 730 are included on the same transceiver chip 735, although in alternative configurations, the transmitter portion 730Tx may be included on a separate chip from the receiver portion 730Rx, without departing from the scope of the present teachings. In various configurations, the duplexer 710, the balun/impedance matching circuit 720, and the transceiver 730 may be incorporated into various types of portable communication devices, such as cellular telephones, PDAs, electronic gaming devices, laptop computers and the like.

The duplexer 710 interfaces the transceiver 730 with the antenna 705 for downlink and uplink frequency bands, corresponding to a particular communication standard, as discussed above. FIG. 7 shows only the receive portion 710Rx of the duplexer 710 for convenience of explanation. The duplexer receive portion 710Rx includes FBAR Rx filter 712, which has an input connected to the antenna 705 and a single-ended output corresponding to the single-ended output $SE1_{OUT}$ of the duplexer receive portion 710Rx. The FBAR Rx filter 712 may be a ladder type filter having series and shunt connected acoustic resonators, a phase shifter or other matching circuit, and associated LC components, although the FBAR Rx filter 712 may include other configurations without departing from the scope of the present teachings, as discussed above with reference to the FBAR Rx filter 512 in FIG. 5. The transmit portion 710Tx (not shown) of the duplexer 710 may include an FBAR Tx filter, an output of which is also connected to the antenna 705.

In various embodiments, the duplexer chip 710 containing the duplexer receive portion 710Rx is physically dimensioned to fit in an area of the PCB 700 not necessarily designed for accommodating a duplexer chip with an FBAR Rx filter and a single-ended output. For example, the PCB 700 may be designed for a mobile phone implementation, in which the duplexer chip includes a SAW Rx filter, and thus has a differential output, as opposed to a single-ended output.

The transceiver 730 includes receiver portion 730Rx and transmitter portion 730Tx (not shown), which may be on the same or separate chips, as discussed above. FIG. 7 shows only the receiver portion 730Rx of the transceiver 730 for convenience of explanation. The receiver portion 730Rx includes first and second LNAs 731 and 732, which have inputs corresponding to the first and second differential inputs $D1_{IN}$ and $D2_{IN}$ of the receiver portion 730Rx, respectively. The first and second LNAs 731 and 732 receive and amplify the differential signals from the balun/impedance matching circuit 720. The receiver portion 730Rx further includes I/Q demodulator 733, VGA 734 and ADC 737, which are substantially the same as the I/Q demodulator 533, the VGA 534 and the ADC 537 discussed above with reference to FIG. 5.

The first differential input $D1_{IN}$ of the first LNA 731 is connected to the single-ended output $SE1_{OUT}$ of the FBAR Rx filter 712 via receive path 728, which includes first capacitor 721. The second differential input $D2_{IN}$ of the second LNA 732 is connected to ground via ground path 729, which includes second capacitor 722 and third capacitor 725. Each of the first and second inductors 723 and 724 are connected between the receive path 728 and the ground path 729, thus forming the balun/impedance matching circuit 720. That is, the first capacitor 721 is connected between the single-ended output $SE1_{OUT}$ of the FBAR Rx filter 712 and the first differential input $D1_{IN}$ of the first LNA 731; the second capacitor 722 is connected between node N1 and ground; the first inductor 723 is connected between the single-ended output $SE1_{OUT}$ and node N1; the second inductor 724 is connected between the first differential input $D1_{IN}$ and the second differential input $D2_{IN}$, and the third capacitor 725 is connected between node N1 and the second differential input $D2_{IN}$ of the second LNA 732. Accordingly, the first capacitor 721, the second capacitor 722, and the first inductor 723 provide balun functionality, and the first capacitor 721, the first inductor 723, the second inductor 724, and the third capacitor 725 provide impedance matching functionality.

As previously discussed, the inclusion of the third capacitor 725 improves DC blocking with respect to the differential signal received by the receiver portion 730Rx. The receiver portion 730Rx may therefore be DC isolated from the single-ended duplexer receive portion 710Rx, particularly when the third capacitor 725 has a large value compared to the first and second capacitors 721 and 722. This prevents leakage current, for example, from throwing off bias circuitry of the first and second LNAs 731 and 732. In an alternative configuration, the third capacitor 725 may be replaced by a third inductor (e.g., as discussed above with respect to third inductor 626 in FIG. 6B), without departing from the scope of the present teachings. The inclusion of the third inductor enhances performance characteristics of the receiver portion 730Rx, including improved insertion loss characteristics.

In the depicted embodiment, the first capacitor 721, the first inductor 723, the second inductor 724 and the third capacitor 725 (or third inductor) are SMT components mounted to the PCB 700. Accordingly, these LC components are arranged substantially the same as a conventional impedance matching circuit used to connect two differential circuits, as discussed above, and can therefore be located in the same area of the PCB 700 where a conventional impedance matching circuit for differential circuits would be located. However, because the second capacitor 722 is a fifth LC component, not included in the conventional impedance matching circuit, it is located in another area.

In the depicted embodiment, the second capacitor 722 is formed on a portion of the Rx duplexer chip 715. For example, the second capacitor 722 may be formed at a pin normally used for the other differential Rx port (that is, the differential Rx port other than the single-ended output $SE1_{OUT}$) in a differential SAW duplexer, but normally used for ground in a single-ended FBAR duplexer. Therefore, the duplexer receive portion 710Rx on the Rx duplexer chip 715 is able to interface with the receiver portion 730RX on the transceiver chip 735 through what would otherwise be a conventional impedance matching circuit on a PCB designed for connecting two differential circuits. Having the second capacitor 722 inside the Rx duplexer chip 715 enables the Rx duplexer chip 715 to replace a differential SAW duplexer chip connected to a matching balun, for example, using the same circuit topology as used for the differential SAW duplexer, but different component values to achieve the combined impedance matching and balun functionality. No changes are needed to the design of the handset PCB (e.g., PCB 700) in this case.

In alternative embodiments, the second capacitor 722 may be formed at a location other than the Rx duplexer chip 715. For example, the second capacitor 722 may be formed between multiple conductive layers of the PCB 700, or formed on the surface of the PCB 700 using SMT components. Of course, other configurations of the second capacitor 722, as well as the other LC components of the balun/impedance matching circuit 720 may be included, without departing from the scope of the present teachings, to provide unique benefits for any particular situation or to meet application specific design requirements of various implementations.

Of course, the respective values of the LC components shown in FIG. 7 may vary to provide unique benefits for any particular situation or to meet application specific design requirements of various implementations. For example, to implement the PCS communication standard, the first capacitor 721 may have a value of about 1.0 pF, the second capacitor 722 may have a value of about 2.3 pF, and the third capacitor may have a value of about 100 pF. Also, the first inductor 723 may have a value of about 4.5 nH, and the second inductor 724 may have a value of about 4.2 nH, for example.

According to the various embodiments, the functions of a balun circuit and an impedance matching circuit are efficiently combined, providing a low noise figure, e.g., for a receiver portion of a transceiver, while maintaining excellent phase and amplitude balance. By combining these functions into one circuit, size and cost are reduced, and insertion loss characteristics are improved, for example, by a factor of about two. Also, the various embodiments allow a single-ended output from any circuit to mimic a differential output circuit using substantially the same circuit topology and/or PCB footprint as a differential SAW impedance matching circuit. Likewise, various configurations enable drop-in replacement of a differential SAW duplexer with a single-ended FBAR duplexer. Also, insertion loss using the balun and impedance matching circuits for a single-ended FBAR duplexer may be improved to the point that it is only about 0.1 dB to 0.2 dB less than insertion loss attained using only an impendence matching circuit for a differential SAW duplexer.

The various components, materials, structures and parameters are included by way of illustration and example only and not in any limiting sense. In view of this disclosure, those skilled in the art can implement the present teachings in determining their own applications and needed components, materials, structures and equipment to implement these applications, while remaining within the scope of the appended claims.

The invention claimed is:

1. An apparatus for providing impedance matching between a single-ended circuit and a differential circuit, the apparatus comprising:
   a first capacitor directly connected between an input/output of the single-ended circuit and a first differential input/output of the differential circuit;

a first inductor directly connected between the input/output of the single-ended circuit and a second differential input/output of the differential circuit;

a second capacitor connected between the second differential input/output of the differential circuit and ground; and a second inductor connected between the first differential input/output of the differential circuit and the second differential input/output of the differential circuit.

2. The apparatus of claim 1, further comprising:

a first trace on a printed circuit board connecting the input/output of the single-ended circuit to the first capacitor; and a second trace on the printed circuit board connecting the first capacitor to the first differential input/output of the differential circuit, the second trace being substantially shorter than the first trace to enhance impedance matching with the differential circuit.

3. The apparatus of claim 1, wherein the first and second capacitors and the first and second inductors are surface mounted technology (SMT) components mounted on a printed circuit board.

4. The apparatus of claim 3, wherein the single-ended circuit comprises a duplexer mounted to the printed circuit board, the duplexer including a film bulk acoustic resonator (FBAR) filter providing the input/output of the single-ended circuit.

5. The apparatus of claim 4, wherein the differential circuit comprises a transceiver mounted to the printed circuit board, the transceiver including a first low noise amplifier connected to the first differential input/output of the differential circuit and a second low noise amplifier connected to the second differential input/output of the differential circuit.

6. An apparatus for providing impedance matching between a duplexer circuit and a transceiver circuit mounted on a printed circuit board, the apparatus comprising:

an impedance matching circuit comprising a first capacitor connected between a single-ended input/output of the duplexer circuit and a first differential input/output of the transceiver, a first inductor connected between the single-ended input/output of the duplexer filter and a first node, an LC component connected between the first node a second differential input/output of the transceiver, and a second inductor connected between the first differential input/output and the second differential input/output of the transceiver; and a balun circuit comprising the first capacitor, the first inductor, and a second capacitor connected between the first node and ground, the balun circuit being configured to convert between unbalanced signals at the single-ended input/output of the duplexer circuit and balanced signals at the first and second differential inputs/outputs of the differential transceiver circuit.

7. The apparatus of claim 6, wherein the duplexer circuit comprises a film bulk acoustic resonator (FBAR) filter connected between the single-ended input/output of the duplexer circuit and an antenna.

8. The apparatus of claim 7, wherein the transceiver circuit comprises a first low noise amplifier connected to the first differential input/output of the transceiver circuit, and a second low noise amplifier connected to the second differential input/output of the transceiver circuit.

9. The apparatus of claim 8, wherein the first capacitor, the first inductor, the LC component and the second inductor are surface mounted technology (SMT) components mounted to the printed circuit board circuit and connecting the duplexer circuit and the transceiver circuit.

10. The apparatus of claim 9, wherein the second capacitor is SMT component mounted to the printed circuit board separate from a duplexer chip containing the duplexer circuit.

11. The apparatus of claim 9, wherein the second capacitor is formed between a plurality of conductive layers of the printed circuit board.

12. The apparatus of claim 9, wherein the second capacitor is formed on a duplexer chip containing the duplexer circuit.

13. The apparatus of claim 12, wherein the duplexer chip fits in an area of the printed circuit board configured to accommodate a duplexer chip including a surface acoustic wave (SAW) filter having a differential input/output.

14. The apparatus of claim 13, wherein the impedance matching circuit is the same as an impedance matching circuit for the SAW filter.

15. The apparatus of claim 6, wherein the LC component comprises a third capacitor, for enhancing DC blocking for the transceiver circuit.

16. The apparatus of claim 6, wherein the LC component comprises a third inductor, for enhancing insertion loss characteristics of the transceiver circuit.

17. An apparatus for converting between an unbalanced signal of a receive portion of a duplexer on a first chip mounted on a printed circuit board and a balanced signal of a receiver portion of a transceiver on a second chip mounted to the printed circuit board, the receive portion of the duplexer comprising a film bulk acoustic resonator (FBAR) filter and the receiver portion of the transceiver comprising first and second low noise amplifiers (LNAs), the apparatus comprising:

a balun circuit comprising a first capacitor connected between a single-ended output of the FBAR filter and a first differential input of the first LNA, a first inductor connected between the single-ended output of the FBAR filter and a first node, and a second capacitor connected between the first node and ground; and an impedance matching circuit comprising the first capacitor, the first inductor, an LC component connected between the first node and a second differential input of the second LNA, and a second inductor connected between the first differential input of the first LNA and the second differential input of the second LNA, wherein the second capacitor is located on the first chip, and wherein the first capacitor, the first inductor, the second inductor and the LC component are mounted on the printed circuit board to connect the first chip and the second chip.

18. The device of claim 17, wherein the LC component comprises a third capacitor, for enhancing DC blocking for the transceiver.

19. The device of claim 17, wherein the LC component comprises a third inductor, for enhancing insertion loss characteristics of the transceiver.

20. The device of claim 17, wherein the first chip fits in an area of the printed circuit board configured for a duplexer chip including a surface acoustic wave (SAW) filter having a differential input/output, and wherein the impedance matching circuit is the same as an impedance matching circuit for the SAW filter.

* * * * *